US012787884B2

(12) United States Patent
Xue et al.

(10) Patent No.: US 12,787,884 B2
(45) Date of Patent: Nov. 3, 2026

(54) SEMICONDUCTOR DEVICE HAVING DEEP TRENCH CAPACITOR AND METHOD FOR MAKING SAME

(71) Applicant: WUHAN XINXIN SEMICONDUCTOR MANUFACTURING CO., LTD., Wuhan (CN)

(72) Inventors: Xiaochen Xue, Wuhan (CN); Beibei Sheng, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 407 days.

(21) Appl. No.: 18/543,478

(22) Filed: Dec. 18, 2023

(65) Prior Publication Data

US 2025/0015066 A1 Jan. 9, 2025

(30) Foreign Application Priority Data

Jul. 3, 2023 (CN) ........................ 202310810936.X

(51) Int. Cl.

*H10W 90/00* (2026.01)
*H10W 70/09* (2026.01)
*H10W 72/00* (2026.01)
*H10W 72/20* (2026.01)
*H10W 90/22* (2026.01)

(52) U.S. Cl.

CPC ......... *H10W 90/00* (2026.01); *H10W 90/701* (2026.01); *H10W 70/09* (2026.01); *H10W 72/07252* (2026.01); *H10W 72/221* (2026.01); *H10W 72/853* (2026.01); *H10W 90/22* (2026.01); *H10W 90/726* (2026.01)

(58) Field of Classification Search

CPC ... H10W 90/00; H10W 90/701; H10W 90/22; H10W 90/726; H10W 72/221; H10W 72/853; H10W 72/07252; H10W 70/09

USPC .......................................................... 257/678

See application file for complete search history.

(56) References Cited

U.S. PATENT DOCUMENTS 8,361,875 B2 * 1/2013 Zhu ........................ H10B 12/03 438/386
8,895,360 B2 * 11/2014 Chang ................. H10W 20/023 438/109

(Continued)

*Primary Examiner* — Eric W Jones

(74) *Attorney, Agent, or Firm* — MUNCY, GEISSLER, OLDS & LOWE, P.C.

(57) ABSTRACT

A semiconductor device and a method for making it are disclosed. The semiconductor device includes a first substrate having a front side and a backside opposite thereto, wherein a device structure is formed at the front side of the first substrate, and a DTC is formed at the backside of the first substrate; a first insulating layer and a second insulating layer, which are formed on the front side and the backside of the first substrate, respectively; a first interconnect structure and a second interconnect structure, the first interconnect structure formed in the first insulating layer, the second interconnect structure formed in the second insulating layer; and a plug structure formed in the first insulating layer, one end of the plug structure electrically connected to the device structure through the first interconnect structure, the other end of the plug structure electrically connected to the DTC through the second interconnect structure.

17 Claims, 6 Drawing Sheets

(56) References Cited

U.S. PATENT DOCUMENTS

| | | | | |
|---|---|---|---|---|
| 10,910,321 | B2 * | 2/2021 | Hsieh | H01F 17/0033 |
| 2011/0227158 | A1 * | 9/2011 | Zhu | H10W 20/20<br>438/479 |
| 2023/0069315 | A1 * | 3/2023 | Chang | H10D 1/716 |
| 2023/0352404 | A1 * | 11/2023 | Kuo | H10W 20/40 |

* cited by examiner

SEMICONDUCTOR DEVICE HAVING DEEP TRENCH CAPACITOR AND METHOD FOR MAKING SAME

CROSS-REFERENCE TO RELATED APPLICATION

This application claims the priority of Chinese patent application number 202310810936.X, filed on Jul. 3, 2023, and entitled "SEMICONDUCTOR DEVICE AND METHOD FOR MAKING SAME", the entire contents of which are incorporated herein by reference.

TECHNICAL FIELD

The present invention relates to the field of semiconductor integrated circuit (IC) fabrication and, in particular, to a semiconductor device and a method for making the device.

BACKGROUND

As the critical-dimension of integrated circuit (IC) processes continues shrinking and their function density continues increasing, noise in IC circuits exerts an increasing impact on operating performance of chips. Deep trench capacitors (DTCs) are passive capacitors with good decoupling and filtering properties. They can filter out high-frequency noise and allow for a lower minimum voltage. Therefore, DTCs are very helpful in improving operating performance of IC devices.

Referring to FIGS. 1*a* to 1*c*, an existing method for making an IC device include the steps as detailed below. At first, as shown in FIGS. 1*a* to 1*b*, a first wafer 11 for providing a DTC 111 and a second wafer 12 for providing a device structure 121 are fabricated. The first wafer 11 includes a first substrate 112 and first insulating dielectric layer 113 formed on the first substrate 112. The DTC 111 extends from a position within the first substrate 112 to a position between the first substrate 112 and the first insulating dielectric layer 113. In the first insulating dielectric layer 113, a first metal interconnect structure 114, a first pad 115 electrically connected to the first metal interconnect structure 114, a third metal interconnect structure 117 and a third pad 118 electrically connected to the third metal interconnect structure 117 are formed. A portion of an electrode plate of the DTC 111 is electrically connected to the first pad 115 through the first metal interconnect structure 114, and another portion of the electrode plate of the DTC 111 is electrically connected to the third pad 118 through the third metal interconnect structure 117. Additionally, conductive structures 116 are formed in the first substrate 112, and each of the first metal interconnect structure 114 and the third metal interconnect structure 117 is independently electrically connected to a corresponding one of the conductive structures 116 (it is noted that the conductive structure 116 electrically connected to the first metal interconnect structure 114 is not shown). The second wafer 12 includes a second substrate 122 and a second insulating dielectric layer 123 formed on the second substrate 122. The device structure 121 is formed in the second substrate 122. In the second insulating dielectric layer 123, a second metal interconnect structure 124 and a second pad 125 electrically connected to the second metal interconnect structure 124 are formed. The device structure 121 is electrically connected to the second pad 125 through the second metal interconnect structure 124. Next, as shown in FIG. 1*c*, the first wafer 11 is bonded to the second wafer 12 by micro-bumps 13 located between the first pad 115 and the second pad 125 and between the third pad 118 and the second pad 125, so as to achieve an electrical connection of the first pad 115 and the second pad 125, and an electrical connection of the third pad 118 and the second pad 125. Via plug structures (not shown) electrically connected to the conductive structures 116 and pads (not shown) electrically connected to the via plug structures are then formed on a backside of the first substrate 112 to enable external connection of the DTC 111 and the device structure 121.

However, in the resulting device, since the DTC and the device structure are formed in different wafers, the circuit path for external connection of the DTC and the device structure is long and tends to lead to low decoupling efficiency.

Therefore, there is an urgent need to achieve a shorter circuit path and hence improved decoupling efficiency.

SUMMARY OF THE INVENTION

It is an object of the present invention to provide a semiconductor device and a method for making it, which enable a shorter circuit path for external electrical connection of a DTC and a device structure and hence increased decoupling efficiency and allow more components to be integrated per unit area.

To this end, the present invention provides a semiconductor device, comprising:

- a first substrate comprising a front side and a backside opposite to the front side, wherein a device structure is formed at the front side of the first substrate, and a DTC is formed at the backside of the first substrate;
- a first insulating layer and a second insulating layer, which are formed on the front side and the backside of the first substrate, respectively;
- a first interconnect structure and a second interconnect structure, the first interconnect structure formed in the first insulating layer, the second interconnect structure formed in the second insulating layer; and
- a plug structure formed in the first insulating layer, a first end of the plug structure electrically connected to the device structure through the first interconnect structure, a second end of the plug structure electrically connected to the DTC through the second interconnect structure.

Optionally, the plug structure may extend from the first insulating layer into the first substrate, and further extends through the first substrate.

Optionally, an end surface of the plug structure located within the first insulating layer may be in the same layer as any one of conductive layers in the first interconnect structure.

Optionally, the DTC may comprise:

- a stack of at least two conductive material layers and at least one dielectric material layer located between adjacent conductive material layers, which are formed in a deep trench in the backside of the first substrate, the conductive material layer and the dielectric material layer further extending to the backside of the first substrate around the deep trench, the conductive material layer electrically isolated from the first substrate.

Optionally, the semiconductor device may further comprise:

- a first pad, a second pad and a third interconnect structure, each of the first and second pads formed on the side of the second insulating layer facing away from the first substrate, the first pad electrically connected to a portion of the conductive material layers in the DTC and the second end of the plug structure through the second interconnect structure, the third interconnect structure formed in the second insulating layer, the second pad electrically connected to the remaining portion of the conductive material layers in the DTC through the third interconnect structure; and a passivation layer formed on the side of the second insulating layer facing away from the first substrate, wherein the passivation layer extends from the second insulating layer and covers a portion of the first pad and a portion of the second pad.

Optionally, the semiconductor device may further comprise a second substrate bonded to a side of the first insulating layer facing away from the first substrate.

The present invention also provides a method for making a semiconductor device, comprising:

providing a first substrate having a front side and a backside opposite to the front side, wherein a device structure is formed at the front side of the first substrate;

forming a first insulating layer on the front side of the first substrate;

forming a first interconnect structure and a plug structure in the first insulating layer, the plug structure extending from the first insulating layer into the first substrate, a first end of the plug structure electrically connected to the device structure through the first interconnect structure;

forming a DTC on the backside of the first substrate;

forming a second insulating layer on the backside of the first substrate; and forming a second interconnect structure in the second insulating layer, the second insulating layer covering the DTC and a second end of the plug structure, the plug structure electrically connected at the second end to the DTC through the second interconnect structure.

Optionally, the plug structure may extend from the first insulating layer into the first substrate, and further extends through the first substrate.

Optionally, in a process of forming the first interconnect structure in the first insulating layer, during a formation of any conductive layer in the first interconnect structure, a hole is formed in the first insulating layer, and a conductive material is filled into the hole to form the plug structure, wherein an end surface of the plug structure located within the first insulating layer is in a same layer as any one of conductive layers in the first interconnect structure.

Optionally, the semiconductor device may further comprise, before the DTC is formed on the backside of the first substrate, bonding the first insulating layer to a second substrate and partially removing the first substrate from its backside so that the second end of the plug structure is exposed.

Optionally, forming the DTC on the backside of the first substrate may comprise:

forming a deep trench in the backside of the first substrate;

forming a stack of at least two conductive material layers and at least one dielectric material layer located between adjacent conductive material layers, to form the DTC, the conductive material layer and the dielectric material layer further extending to the backside of the first substrate around the deep trench, the conductive material layers electrically isolated from the first substrate.

Optionally, during the formation of the second interconnect structure in the second insulating layer, a third interconnect structure may be further formed in the second insulating layer, wherein the method further comprises:

forming a first pad and a second pad on a side of the second insulating layer facing away from the first substrate, the first pad electrically connected to a portion of the conductive material layers in the DTC and the second end of the plug structure through the second interconnect structure, the second pad electrically connected to a remaining portion of the conductive material layers in the DTC through the third interconnect structure; and forming a passivation layer on the side of the second insulating layer facing away from the first substrate, the passivation layer extending from the second insulating layer and covering a portion of the first pad and a portion of the second pad.

Compared with the prior art, the present invention has the benefits as follows:

1. It provides a semiconductor device comprising a first substrate comprising a front side and a backside opposite to the front side, wherein a device structure is formed at the front side of the first substrate, and a DTC is formed at the backside of the first substrate; a first insulating layer and a second insulating layer, which are formed on the front side and the backside of the first substrate, respectively; a first interconnect structure and a second interconnect structure, the first interconnect structure formed in the first insulating layer, the second interconnect structure formed in the second insulating layer; and a plug structure formed in the first insulating layer, the first end of the plug structure electrically connected to the device structure through the first interconnect structure, the second end of the plug structure electrically connected to the DTC through the second interconnect structure. This design allows for a shorter circuit path for external electrical connection of the DTC and the device structure and hence increased decoupling efficiency. Moreover, it allows more components to be integrated per unit area.
2. It provides a method for making a semiconductor device comprising, providing a first substrate having a front side and a backside opposite to the front side, wherein a device structure is formed at the front side of the first substrate; forming a first insulating layer on the front side of the first substrate, and a first interconnect structure and a plug structure in the first insulating layer, the plug structure extending from the first insulating layer into the first substrate, the first end of the plug structure electrically connected to the device structure through the first interconnect structure; forming a DTC on the backside of the first substrate; and forming a second insulating layer on the backside of the first substrate and a second interconnect structure in the second insulating layer, the second insulating layer covering the DTC and the second end of the plug structure, the plug structure electrically connected at the second end to the DTC through the second interconnect structure. This design allows for a shorter circuit path for external electrical connection of the DTC and the device structure and hence increased decoupling efficiency. Moreover, it allows more components to be integrated per unit area.

BRIEF DESCRIPTION OF THE DRAWINGS

In FIGS. 1 to 4*f*,

11, a first wafer; 111, a DTC; 112, a first substrate; 113, a first insulating dielectric layer; 114, a first metal interconnect structure; 115, a first pad; 116, a conductive structure; 117, a third metal interconnect structure; 118, a third pad; 12, a second wafer; 121, a device structure; 122, a second substrate; 123, a second insulating dielectric layer; 124, a second metal interconnect structure; 125, a second pad; 13, a micro-bump; 211, a first substrate; 212, a first insulating layer; 213, a device structure; 214, a first interconnect structure; 215, a plug structure; 2151, a conductive structure; 2152, a third insulating layer; 216, an STI structure; 22, a second substrate; 221, a bonding layer; 23, a DTC; 231, a dielectric material layer; 232, a conductive material layer; 233, a deep trench; 234, a hard mask layer; 235, a spacer layer; 24, a second insulating layer; 251, a second interconnect structure; 252, a third interconnect structure; 261, a first pad; 262, a second pad; and 27, a passivation layer.

DETAILED DESCRIPTION

Objects, advantages and features of the present invention will become more apparent upon reading the following more detailed description of semiconductor devices and methods provided therein with reference to the accompanying drawings. Note that the figures are provided in a very simplified form not necessarily drawn to exact scale and for the only purpose of facilitating easy and clear description of the embodiments.

In an embodiment of the present invention, a semiconductor device is provided, which comprises: a first substrate having a front side and a backside opposite to the front side, wherein a device structure is formed at the front side of the first substrate, and a deep trench capacitor (DTC) is formed at the backside of the first substrate; a first insulating layer and a second insulating layer, which are formed on the front side and the backside of the first substrate, respectively; a first interconnect structure and a second interconnect structure, the first interconnect structure formed in the first insulating layer, the second interconnect structure formed in the second insulating layer; and a plug structure formed in the first insulating layer, the first end of the plug structure electrically connected to the device structure through the first interconnect structure, the second end of the plug structure electrically connected to the DTC through the second interconnect structure.

Figure 1A:
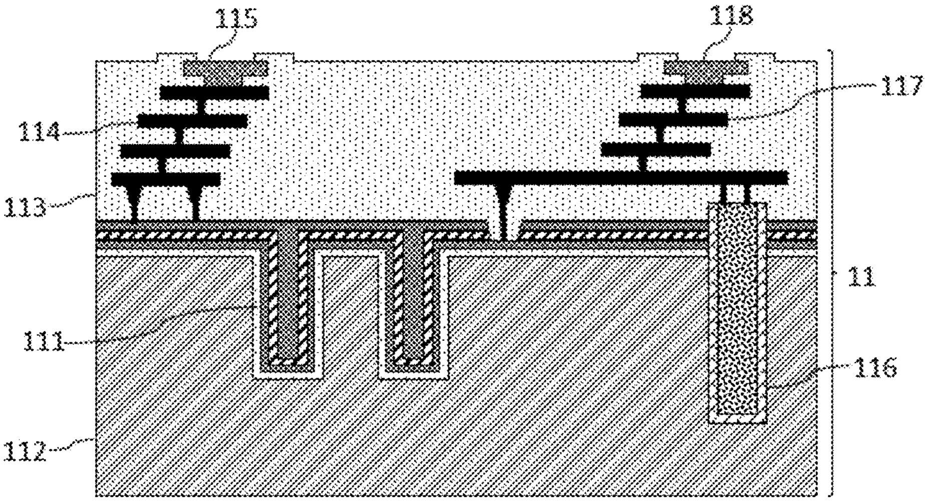
FIGS. 1*a* to 1*c* are schematic illustrations of intermediate structures formed in a method for making a semiconductor device.
Figure 1B:
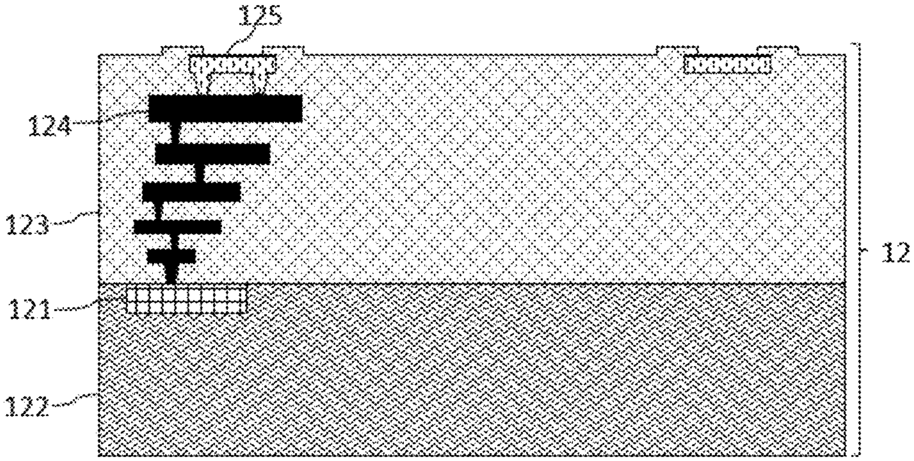
Figure 1C:
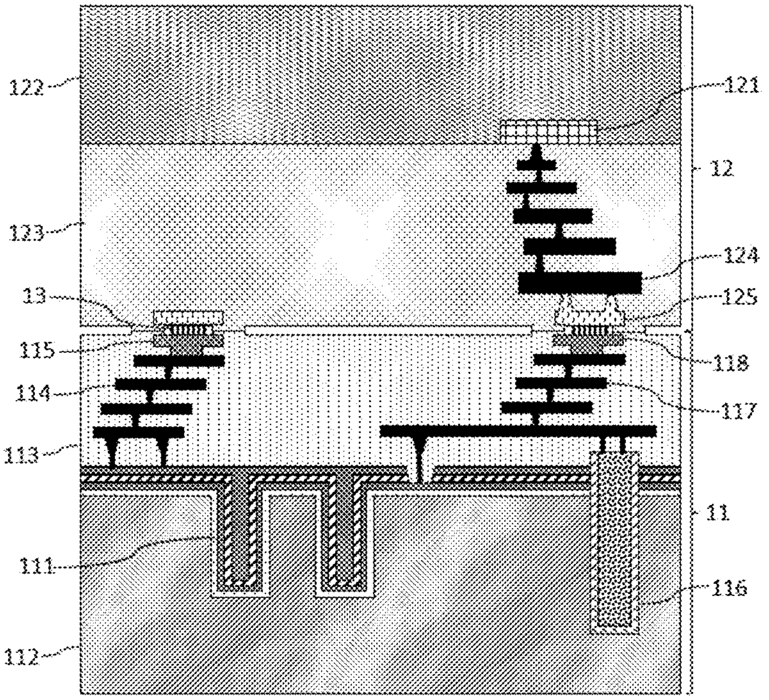
Figure 2:
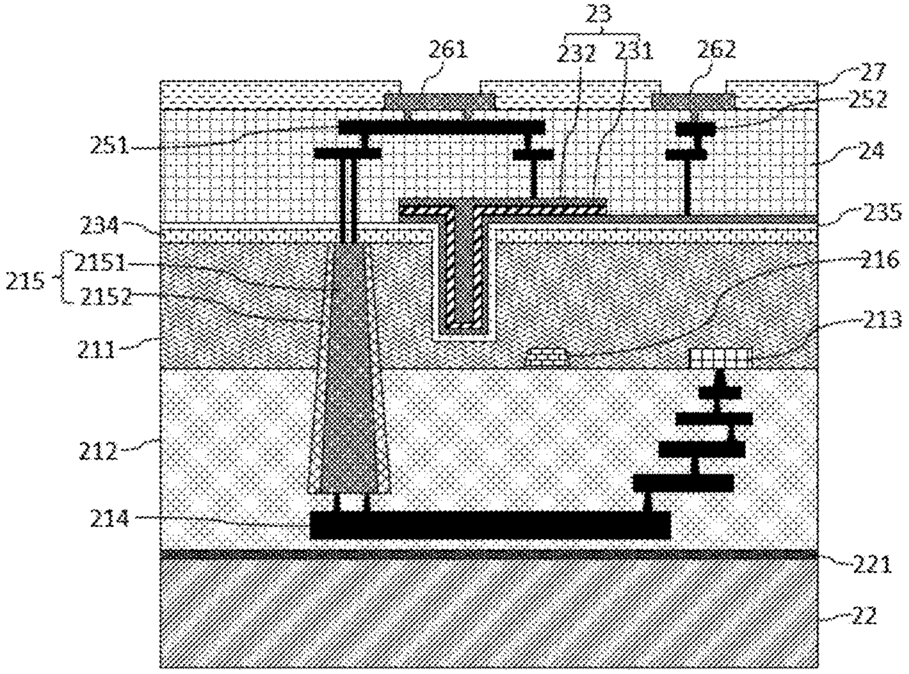
FIG. 2 is a schematic longitudinal cross-sectional view of a semiconductor device according to an embodiment of the present invention.

The semiconductor device provided in this embodiment is described below in detail with reference to FIG. 2.

The first substrate 211 includes the front side and the backside opposite to the front side. The device structure 213 is formed at the front side of the first substrate 211, and the DTC 23 is formed at the backside of the first substrate 211.

The first substrate 211 may include a substrate, or may include a substrate and a single film layer or multiple film layers formed at a front side and/or a backside of the substrate. The substrate may be made of a semiconductor material, glass, ceramic or other material. In case of the substrate being made of a semiconductor material, it may include, but is not limited to including, doped or undoped silicon, doped or undoped germanium, semiconductor on insulator (SOI), silicon carbide, gallium arsenide, gallium phosphide, indium phosphide, indium arsenide and/or indium antimonide, SiGe, GaAsP, AlInAs, AlGaAs, GaInAs, GaInP and/or GaInAsP, or a combination thereof. In some embodiments, the first substrate 211 may be a wafer or die.

In the first substrate 211, for example, a shallow trench isolation (STI) structure 216 may be further formed.

The device structure 213 may be, for example, an active device (e.g., transistor, diode, triode, etc.), a passive device (e.g., capacitor, resistor, inductor, etc.), or a combination thereof. The device may be fabricated using any method suitable for fabricating it.

A hard mask layer 234 may be formed at the backside of the first substrate 211, and an opening may be formed in the hard mask layer 234, in which the backside of the first substrate 211 is exposed. A deep trench may be formed in the backside of the first substrate 211 exposed in the opening and a spacer layer 235 is formed on the inner wall of the deep trench. The spacer layer 235 may additionally extend on the backside of the first substrate 211 around the deep trench. The DTC 23 includes a stack of at least two conductive material layers 232 and dielectric material layer(s) 231 located between adjacent conductive material layers 232 formed therein. The conductive material layer 232 and the dielectric material layer(s) 231 may additionally extend over the spacer layer 235 around the deep trench, and these extensions of the conductive material layers 232 around the deep trench may be each partially exposed to enable external electrical connection thereof. The conductive material layers 232 are electrically isolated from the first substrate 211 by the spacer layer 235.

The first insulating layer 212 and/or the second insulating layer 24 may be formed on the front side and the backside of the first substrate 211, respectively. In case of the hard mask layer 234 and the spacer layer 235 being formed at the backside of the first substrate 211, the second insulating layer 24 is formed on the spacer layer 235.

The first insulating layer 212 and/or the second insulating layer 24 may each include a single or multiple dielectric layers. Each dielectric layer may include, but is not limited to including, for example, a low-k dielectric material, phosphosilicate glass (PSG), borosilicate glass (BSG), borophosphosilicate glass (BPSG), undoped silicate glass (USG), silicon oxide, silicon nitride, silicon oxynitride, silicon carbide or carbon-doped silicon dioxide, and may be formed by, for example, spin coating, lamination, atomic layer deposition (ALD) or chemical vapor deposition (CVD).

The first interconnect structure 214 is formed in the first insulating layer 212, and the second interconnect structure 251 is formed in the second insulating layer 24.

The first interconnect structure 214 and/or the second interconnect structure 251 may each include multiple conductive layers M1 to Mt stacked one above another and conductive plug(s) connecting adjacent conductive layers. The conductive layer M1 may also be referred to as a bottommost conductive layer and the conductive layer Mt as a topmost conductive layer. The first interconnect structure 214 and/or the second interconnect structure 251 may each include a conductive material, such as tungsten, cobalt, nickel, copper, silver, gold, aluminum or a combination thereof. Each conductive layer is formed in a corresponding one of the dielectric layers in the first insulating layer 212 and/or the second insulating layer 24.

The plug structure 215 is formed in the first insulating layer 212. The first end of the plug structure 215 is electrically connected to the device structure 213 through the first interconnect structure 214, and the second end of the plug structure 215 is electrically connected to the DTC 23 through the second interconnect structure 251.

In one embodiment, the plug structure 215 may extend, at the other end, from the first insulating layer 212 into and through the first substrate 211 so as to be flush with the first substrate 211 and covered by the hard mask layer 234. In another embodiment, the plug structure 215 may extend, at the other end, from the first insulating layer 212 into but not through the first substrate 211. In this case, the second interconnect structure 251 may extend from the second insulating layer 24 into the first substrate 211, so as to be electrically connected to the plug structure 215, and the extension portion of the second interconnect structure 251 within the first substrate 211 may be insulated from the first substrate 211. Alternatively, the plug structure 215 may extend, at the other end, from the first insulating layer 212 through the first substrate 211 into the second insulating layer 24, so as to be electrically connected to the plug structure 215 there.

The end surface of the plug structure 215 within the first insulating layer 212 may be located in the same layer as any one of the conductive layers in the first interconnect structure 214.

The plug structure 215 includes a conductive structure 2151 and a third insulating layer 2152. The first end of the conductive structure 2151 is electrically connected to the device structure 213 via the first interconnect structure 214, and the second end of the conductive structure 2151 is electrically connected to the DTC 23 via the second interconnect structure 251. Moreover, for example, in case of the plug structure 215 extending, at the other end, from the first insulating layer 212 into and through the first substrate 211, a hole (not shown) may be formed in the first insulating layer 212, which extends into and through the first substrate 211, and the conductive structure 2151 may be filled in the hole. The third insulating layer 2152 is sandwiched between the conductive structure 2151 and a side wall of the hole. The conductive structure 2151 is insulated from the substrate 211 by the third insulating layer 2152.

The semiconductor device may further include a second substrate 22 bonded to a side of the first insulating layer 212 facing away from the first substrate 211. Alternatively, the second substrate 22 may be bonded to a side of the second insulating layer 24 facing away from the first substrate 211.

The second substrate 22 may contain no functional structures. Alternatively, the second substrate 22 may contain functional structures. In some embodiments, functional structures contained in the second substrate 22 may be located within, and/or within a peripheral region of, and/or at a surface of the second substrate 22.

In some embodiments, the second substrate 22 may be a wafer or die.

A bonding layer 221 may be formed on the second substrate 22, and the first substrate 211 may be bonded to the second substrate 22 through bonding the first insulating layer 212 or the second insulating layer 24 to the bonding layer 221.

The bonding layer 221 may include an insulating layer (not shown) covering the second substrate 22, and a metal layer (not shown) embedded in the insulating layer and exposed in the insulating layer. Additionally, pads (not shown) may be formed in the first insulating layer 212 or the second insulating layer 24 and exposed in the first insulating layer 212 or the second insulating layer, and as a result of the insulating layer being bonded to the first insulating layer 212 or the second insulating layer 24, the metal layer exposed in the insulating layer may be bonded to the pads.

The semiconductor device may further include a third interconnect structure 252, which is formed in the second insulating layer 24 and insulated from the second interconnect structure 251. The second interconnect structure 251 may be electrically connected to a portion of the conductive material layers 232 in the DTC 23, and the third interconnect structure 252 may be electrically connected to the remaining portion of the conductive material layers 232 in the DTC 23.

The semiconductor device further includes:

a first pad 261 and a second pad 262, both formed at the side of the second insulating layer 24 facing away from the first substrate 211, the first pad 261 electrically connected to a portion of the conductive material layers 232 in the DTC 23 and to the second end of the conductive structure 2151 in the plug structure 215 through the second interconnect structure 251, the second pad 262 electrically connected to the remaining portion of the conductive material layers 232 in the DTC 23 through the third interconnect structure 252;

a passivation layer 27 formed at the side of the second insulating layer 24 facing away from the first substrate 211, the passivation layer 27 extending from the second insulating layer 24 and covers a portion of the first pad 261 and a portion of the second pad 262. That is, a portion of the first pad 261 and a portion of the second pad 262 are exposed in the passivation layer 27.

Since the device structure 213 is electrically connected to the first end of the plug structure 215 through the first interconnect structure 214 and the second end of the plug structure 215 is electrically connected to the DTC 23 through the second interconnect structure 251, and the first pad 261 is electrically connected to a portion of the conductive material layers 232 in the DTC 23 and to the plug structure 215 via the second interconnect structure 251, the first pad 261 enables external electrical connection of the device structure 213 and a portion of the conductive material layers 232 in the DTC 23. Moreover, since the second pad 262 is electrically connected to the remaining portion of the conductive material layers 232 in the DTC 23 through the third interconnect structure 252, it enables external electrical connection of the remaining portion of the conductive material layers 232 in the DTC 23.

The first pad 261 and the second pad 262 may be connected to positive and negative poles of a power source, respectively, and the device structure 213 may be connected in parallel with the DTC 23.

As can be seen from the above description, in the semiconductor device provided therein, both the DTC 23 and the device structure 213 are formed in the first substrate 211, and the components for electrically connecting the DTC 23 to the device structure 213 (i.e., the first interconnect structure 214, the plug structure 215 and the second interconnect structure 251) are formed on the first substrate 211, rather than on the second substrate 22. That is, the DTC 23, the device structure 213 and the structures for electrically connecting the DTC 23 to the device structure 213 are all provided in or on a single substrate. In comparison with arranging the DTC and the device structure in the first and second substrates (i.e., separate substrates), the arrangement of the present invention allows for a shorter circuit path for external electrical connection of the DTC 23 and the device structure 213 and hence increased decoupling efficiency.

Further, in the semiconductor device provided therein, since the DTC 23 and the device structure 213 are formed on the front side and backside of the first substrate 211, respectively, an effective area of the first substrate 211 can be fully utilized, allowing more components to be integrated per unit area. The present invention provides a semiconductor device comprising: a first substrate having a front side and a backside opposite to the front side, wherein a device structure is formed at the front side of the first substrate, and a DTC is formed at the backside of the first substrate; a first insulating layer and a second insulating layer, which are formed on the front side and the backside of the first substrate, respectively; a first interconnect structure and a second interconnect structure, the first interconnect structure formed in the first insulating layer, the second interconnect structure formed in the second insulating layer; and a plug structure formed in the first insulating layer, the first end of the plug structure electrically connected to the device structure through the first interconnect structure, the second end of the plug structure electrically connected to the DTC through the second interconnect structure. The present invention allows for a shorter circuit path for external electrical connection of the DTC and the device structure and hence increased decoupling efficiency. Moreover, it allows more components to be integrated per unit area.

Figure 3:
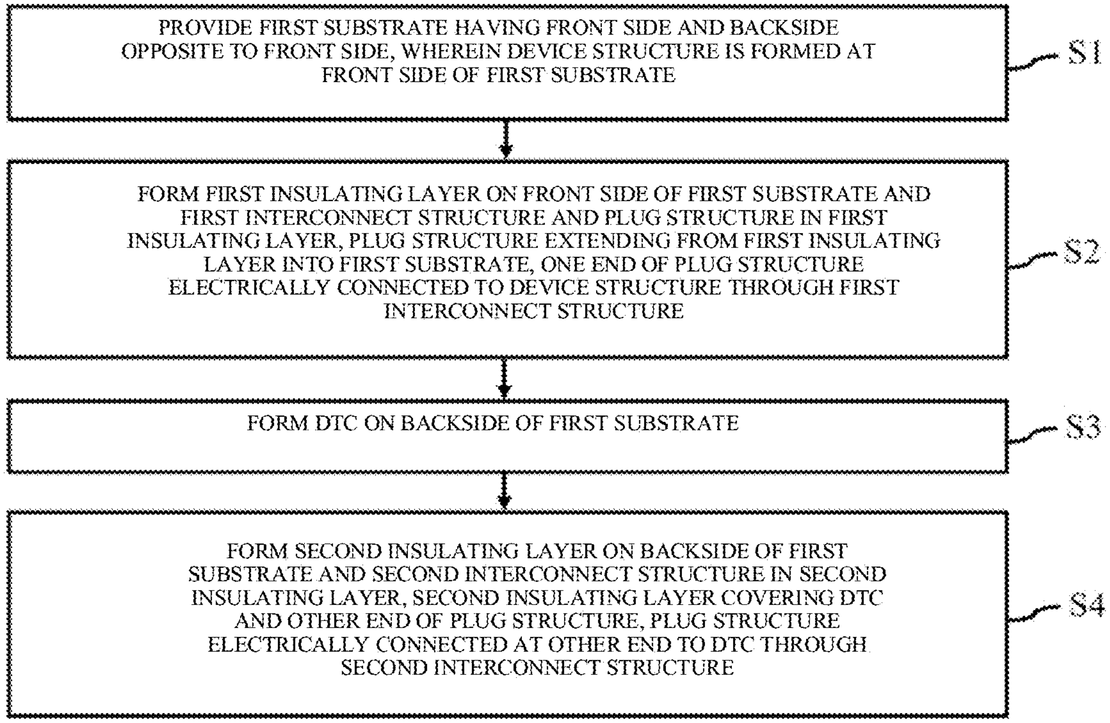
FIG. 3 is a flowchart of a method for making a semiconductor device according to an embodiment of the present invention.

In one embodiment of the present invention, there is provided a method for making a semiconductor device. Reference is now made to FIG. 3, a flowchart of a method for making a semiconductor device according to an embodiment of the present invention. The method includes the steps of:

- S1: providing a first substrate having a front side and a backside opposite to the front side, wherein a device structure is formed at the front side of the first substrate;
- S2: forming a first insulating layer on the front side of the first substrate and a first interconnect structure and a plug structure in the first insulating layer, the plug structure extending from the first insulating layer into the first substrate, the first end of the plug structure electrically connected to the device structure through the first interconnect structure;
- S3: forming a DTC on the backside of the first substrate; and
- S4: forming a second insulating layer on the backside of the first substrate and a second interconnect structure in the second insulating layer, the second insulating layer covering the DTC and the second end of the plug structure, the plug structure electrically connected at the second end to the DTC through the second interconnect structure.

The method provided in this embodiment is described below in detail with reference to FIGS. 4*a* to 4*f*.

Figure 4A:
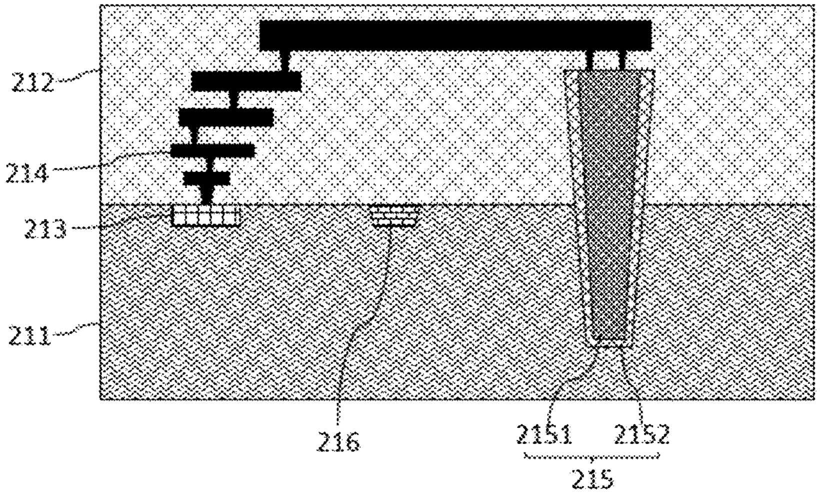
FIGS. 4*a* to 4*f* are schematic illustrations of intermediate structures formed in the method of FIG. 3.

In step S1, as shown in FIG. 4*a*, a first substrate 211 is provided, which has a front side and a backside opposite to the front side. A device structure 213 is formed at the front side of the first substrate 211.

The first substrate 211 may include a substrate, or may include a substrate and a single film layer or multiple film layers formed at a frontside and/or a backside of the substrate. The substrate may be made of a semiconductor material, glass, ceramic or other material. In case of the substrate being made of a semiconductor material, it may include, but is not limited to including, doped or undoped silicon, doped or undoped germanium, semiconductor on insulator (SOI), silicon carbide, gallium arsenide, gallium phosphide, indium phosphide, indium arsenide and/or indium antimonide, SiGe, GaAsP, AlInAs, AlGaAs, GaInAs, GaInP and/or GaInAsP, or a combination thereof. In some embodiments, the first substrate 211 may be a wafer or die.

In the first substrate 211, for example, an STI structure 216 may be further formed.

The device structure 213 may be, for example, an active device (e.g., transistor, diode, triode, etc.), a passive device (e.g., capacitor, resistor, inductor, etc.), or a combination thereof. The device may be fabricated using any method suitable for fabricating it.

In step S2, as shown in FIG. 4*a*, a first insulating layer 212 is formed on the frontside of the first substrate 211, and a first interconnect structure 214 and a plug structure 215 are formed in the first insulating layer 212. The plug structure 215 extends from the first insulating layer 212 into the first substrate 211, and first end of the plug structure 215 is electrically connected to the device structure 213 through the first interconnect structure 214.

The first insulating layer 212 may include a single dielectric layer or multiple dielectric layers. Each dielectric layer may include, but is not limited to including, for example, a low-k dielectric material, PSG, BSG, BPSG, USG, silicon oxide, silicon nitride, silicon oxynitride, silicon carbide or carbon-doped silicon dioxide, and may be formed by, for example, spin coating, lamination, ALD or CVD.

The first interconnect structure 214 may include multiple conductive layers M1 to Mt stacked one above another and conductive plug(s) connecting adjacent conductive layers. The conductive layer M1 may also be referred to as a bottommost conductive layer and the conductive layer Mt as a topmost conductive layer. The first interconnect structure 214 may include a conductive material, such as tungsten, cobalt, nickel, copper, silver, gold, aluminum or a combination thereof. Each conductive layer is formed in a corresponding dielectric layer in the first insulating layer 212.

In the process of forming the first interconnect structure 214 in the first insulating layer 212, during the formation of any of the conductive layers in the first interconnect structure 214, a hole may be formed in the first insulating layer 212, which extends into the first substrate 211, and a conductive material may be filled into the hole to form the plug structure 215. An end surface of the plug structure 215 in the first insulating layer 212 may be located in the same layer as any one of the conductive layers in the first interconnect structure 214.

Moreover, before the hole is filled with the conductive material, a third insulating layer 2152 may be formed on the inner wall of the hole. The filled conductive material may form a conductive structure 2151 of the plug structure 215, which is insulated from the first substrate 211 by the third insulating layer 2152. The first end of the conductive structure 2151 is electrically connected to the device structure 213 via the first interconnect structure 214.

Figure 4B:
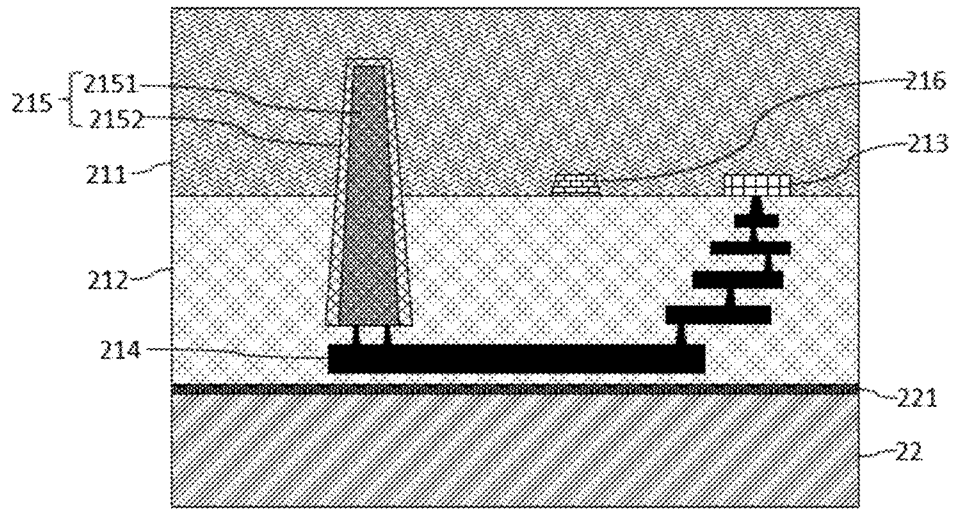

In one embodiment, as shown in FIG. 4*b*, before the DTC 23 and the second insulating layer 24 are subsequently formed at the backside of the first substrate 211, the method may further include bonding the first insulating layer 212 to a second substrate 22. Alternatively, after the second insulating layer 24 and the second interconnect structure 251 are subsequently formed at the backside of the first substrate 211, the method may further include bonding the second insulating layer 24 to the second substrate 22.

The second substrate 22 may contain no functional structures. Alternatively, the second substrate 22 may contain functional structures. In some embodiments, functional structures contained in the second substrate 22 may be located within, and/or within a peripheral region of, and/or at a surface of the second substrate 22.

In some embodiments, the second substrate 22 may be a wafer or die.

A bonding layer 221 may be formed on the second substrate 22, and the first substrate 211 may be bonded to the second substrate 22 through bonding the first insulating layer 212 or the second insulating layer 24 to the bonding layer 221.

The bonding layer 221 may include an insulating layer (not shown) covering the second substrate 22, and a metal layer (not shown) embedded in the insulating layer and exposed in the insulating layer. Additionally, pads (not shown) may be formed in the first insulating layer 212 or the second insulating layer 24 and exposed in the first insulating layer 212 or the second insulating layer 24, and as a result of the insulating layer being bonded to the first insulating layer 212 or the second insulating layer 24, the metal layer exposed in the insulating layer may be bonded to the pads.

Suitable bonding methods may include fusion bonding, thermal compression bonding, vacuum bonding at a low temperature, anodic bonding, eutectic bonding and hybrid bonding, for example.

Figure 4C:
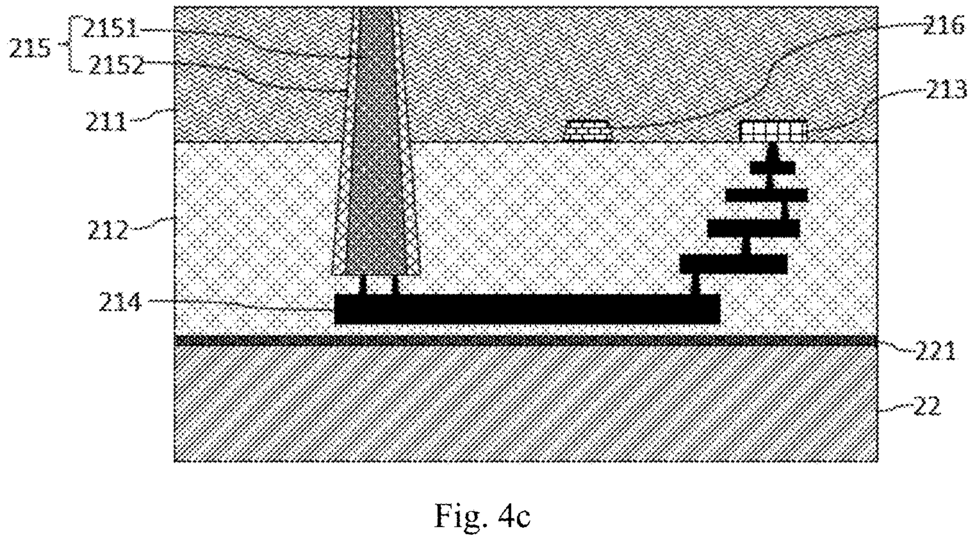

Further, before or after the first insulating layer 212 is bonded to the second substrate 22, the first substrate 211 may be partially removed from the backside thereof so that an end surface of the plug structure 215 at the second end is exposed. As a result, the plug structure 215 extends from the first insulating layer 212 into and through the first substrate 211 so as to be flush with the first substrate 211, as shown in FIG. 4*c*. Alternatively, the first substrate 211 may be partially removed from the backside thereof so that both the end surface and a portion of the side wall of the plug structure 215 at the second end are exposed. As a result, the plug structure 215 extends from the first insulating layer 212 through the first substrate 211 and protrudes out of the first substrate 211. That is, the plug structure 215 is raised over the first substrate 211 at the second end. In this process, the third insulating layer 2152 is also partially removed at the second end of the plug structure 215, exposing the conductive structure 2151.

In another embodiment, the first substrate 211 may be partially removed from the backside thereof so that the second end of the plug structure 215 is not exposed. Alternatively, the first substrate 211 may not be partially removed from the backside thereof. In this case, the plug structure 215 extends, at the second end, from the first insulating layer 212 into but not through the first substrate 211.

The partial removal of the first substrate 211 may be accomplished by a chemical mechanical polishing (CMP) or etching process.

Figure 4D:
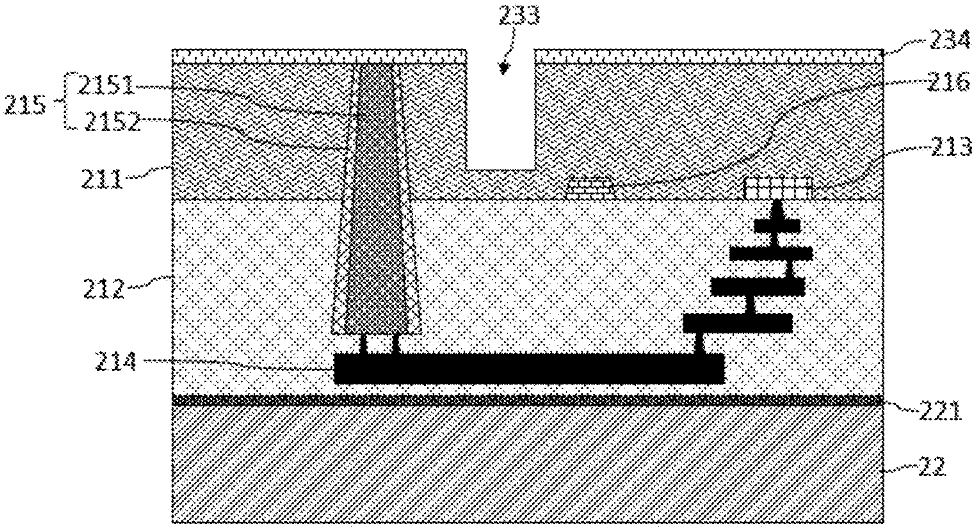
Figure 4E:
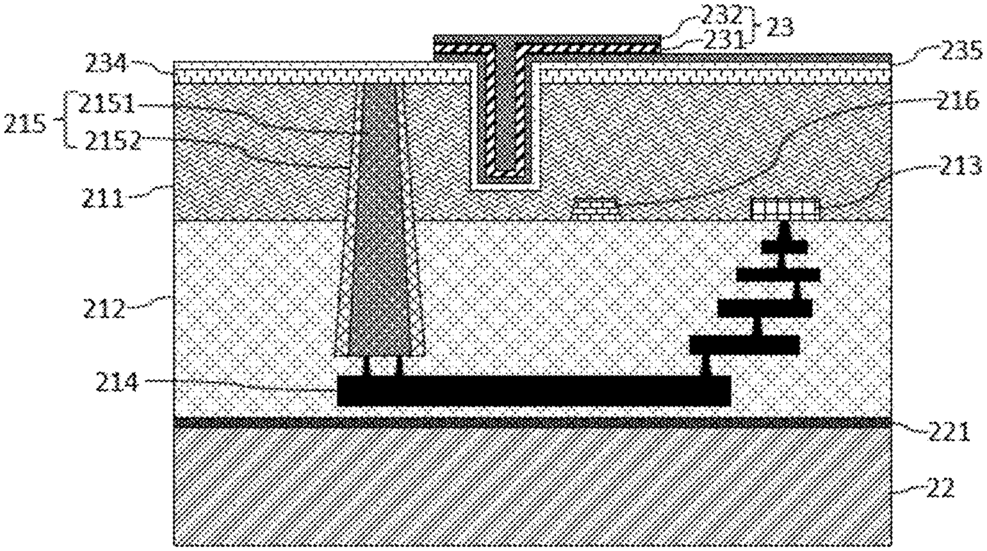

In step S3, as shown in FIGS. 4*d* to 4*e*, a DTC 23 is formed on the backside of the first substrate 211.

The formation of the DTC 23 on the backside of the first substrate 211 may include: first of all, as shown in FIG. 4*d*, forming, on the backside of the first substrate 211, a hard mask layer 234 covering the second end of the plug structure 215 and an opening, in which the backside of the first substrate 211 is exposed; subsequently, as shown in FIG. 4*d*, with the hard mask layer 234 serving as a mask, etching the backside of the first substrate 211 exposed in the opening, thereby forming a deep trench 233 in the backside of the first substrate 211; afterwards, as shown in FIG. 4*e*, forming a spacer layer 235 in the deep trench 233, which additionally extends over the hard mask layer 234 around the deep trench 233; after that, as shown in FIG. 4*e*, forming, in the deep trench 233, a stack of at least two conductive material layers 232 and dielectric material layer(s) 231 located between adjacent the conductive material layers 232, resulting in the formation of the DTC 23. The conductive material layer 232 and the dielectric material layer 231 additionally extend over the spacer layer 235 around the deep trench 233, and the conductive material layers 232 are electrically isolated from the first substrate 211 by the spacer layer 235. As shown in FIG. 4*e*, an etching process is performed on the extension portions of the conductive material layers 232 and the dielectric material layer(s) 231 around the deep trench 233 so that the extension portions of the conductive material layers 232 around the deep trench 233 are each exposed.

Figure 4F:
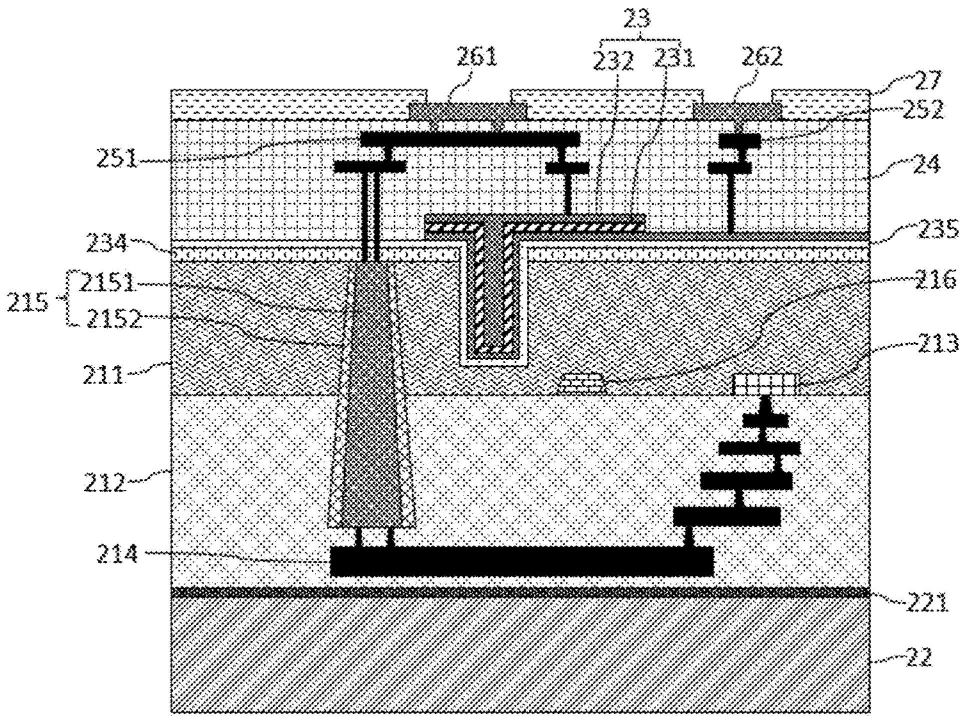

In step S4, as shown in FIG. 4*f*, a second insulating layer 24 is formed on the backside of the first substrate 211 and a second interconnect structure 251 is formed in the second insulating layer 24. The second insulating layer 24 covers the DTC 23 and the second end of the plug structure 215. The second end of the plug structure 215 is electrically connected to the DTC 23 through the second interconnect structure 251.

In case of the hard mask layer 234 and the spacer layer 235 being formed on the backside of the first substrate 211, the second insulating layer 24 may be formed on the spacer layer 235.

The second insulating layer 24 may include a single dielectric layer or multiple dielectric layers. Each dielectric layer may include, but is not limited to including, for example, a low-k dielectric material, PSG, BSG, BPSG, USG, silicon oxide, silicon nitride, silicon oxynitride, silicon carbide or carbon-doped silicon dioxide, and may be formed by, for example, spin coating, lamination, ALD or CVD.

In case of the plug structure 215 extending, at the other end, from the first insulating layer 212 into and through the first substrate 21 and is flush with the other side of the first substrate 211 or protrude out of the first substrate 211, the second interconnect structure 251 may extend through the second insulating layer 24, the spacer layer 235 and the hard mask layer 234 and be electrically connected to the conductive structure 2151 in the plug structure 215. In case of the plug structure 215 extending, at the other end, from the first insulating layer 212 into but not through the first substrate 211, the second interconnect structure 251 may extend through the second insulating layer 24, the spacer layer 235 and the hard mask layer 234 and further extends into the first substrate 211 so as to be electrically connected to the conductive structure 2151 in the plug structure 215.

Further, in the process of forming the second interconnect structure 251 in the second insulating layer 24, a third interconnect structure 252 may be formed in the second insulating layer 24, which is insulated from the second interconnect structure 251. The second interconnect structure 251 may be electrically connected to a portion of the conductive material layers 232 in the DTC 23, and the third interconnect structure 252 may be electrically connected to the remaining portion of the conductive material layers 232 in the DTC 23.

The second interconnect structure 251 and/or the third interconnect structure 252 may each include multiple conductive layers M1 to Mt stacked one above another and conductive plug(s) connecting adjacent conductive layers. The conductive layer M1 may also be referred to as a bottommost conductive layer and the conductive layer Mt as a topmost conductive layer. The second interconnect structure 251 and/or the third interconnect structure 252 may include a conductive material, such as tungsten, cobalt, nickel, copper, silver, gold, aluminum or a combination thereof. Each of the conductive layers is formed in a corresponding dielectric layer in the second insulating layer 24.

The method may further include:

forming a first pad 261 and a second pad 262 at the side of the second insulating layer 24 facing away from the first substrate 211, the first pad 261 electrically connected to a portion of the conductive material layers 232 in the DTC 23 and the second end of the conductive structure 2151 in the plug structure 215 through the second interconnect structure 251, the second pad 262 electrically connected to the remaining portion of the conductive material layers 232 in the DTC 23 through the third interconnect structure 252; and forming a passivation layer 27 at the side of the second insulating layer 24 facing away from the first substrate 211, the passivation layer 27 extending from the second insulating layer 24 and cover portion of the first pad 261 and portion of the second pad 262. That is, the passivation layer 27 exposes the portion of the first pad 261 and the portion of the second pad 262.

Since the device structure 213 is electrically connected to the plug structure 215 through the first interconnect structure 214 and the second end of the plug structure 215 is electrically connected to the DTC 23 through the second interconnect structure 251, and the first pad 261 is electrically connected to a portion of the conductive material layers 232 in the DTC 23 and to the plug structure 215 via the second interconnect structure 251, the first pad 261 enables external electrical connection of the device structure 213 and a portion of the conductive material layers 232 in the DTC 23. Moreover, since the second pad 262 is electrically connected to the remaining portion of the conductive material layers 232 in the DTC 23 through the third interconnect structure 252, it enables external electrical connection of the remaining portion of the conductive material layers 232 in the DTC 23.

The first pad 261 and the second pad 262 may be connected to positive and negative poles of a power source, respectively, and the device structure 213 may be connected in parallel with the DTC 23.

As can be seen from the above description, in the method provided therein, both the DTC 23 and the device structure 213 are formed in the first substrate 211, and the components for electrically connecting the DTC 23 to the device structure 213 (i.e., the first interconnect structure 214, the plug structure 215 and the second interconnect structure 251) are formed on the first substrate 211, rather than on the second substrate 22. That is, the DTC 23, the device structure 213 and the structures for electrically connecting the DTC 23 to the device structure 213 are all provided in a single substrate. In comparison with arranging the DTC and the device structure in the first and second substrates (i.e., separate substrates), the arrangement of the present invention allows for a shorter circuit path for external electrical connection of the DTC 23 and the device structure 213 and hence increased decoupling efficiency.

Further, in the method provided therein, since the DTC 23 and the device structure 213 are formed on the front side and backside of the first substrate 211, respectively, an effective area of the first substrate 211 can be fully utilized, allowing more components to be integrated per unit area. The present invention provides a method for making a semiconductor device comprising: providing a first substrate having a front side and a backside opposite to the front side, wherein a device structure is formed at the front side of the first substrate; forming a first insulating layer on the front side of the first substrate, and a first interconnect structure and a plug structure in the first insulating layer, the plug structure extending from the first insulating layer into the first substrate, the first end of the plug structure electrically connected to the device structure through the first interconnect structure; forming a DTC on the backside of the first substrate; and forming a second insulating layer on the backside of the first substrate and a second interconnect structure in the second insulating layer, the second insulating layer covering the DTC and the second end of the plug structure, the plug structure electrically connected at the second end to the DTC through the second interconnect structure. According to this method, a shorter circuit path for external electrical connection of the DTC and the device structure and hence increased decoupling efficiency can be achieved. Moreover, more components can be integrated per unit area.

The description presented above is merely that of some preferred embodiments of the present invention and is not intended to limit the scope thereof in any sense. Any and all changes and modifications made by those of ordinary skill in the art based on the above teachings fall within the scope as defined in the appended claims.

What is claimed is:

1. A semiconductor device, comprising:

a first substrate comprising a front side and a backside opposite to the front side, wherein a device structure is formed at the front side of the first substrate, and a deep trench capacitor (DTC) is formed at the backside of the first substrate;

a first insulating layer and a second insulating layer, which are formed on the front side and the backside of the first substrate, respectively;

a first interconnect structure, a second interconnect structure and a third interconnect structure, wherein the first interconnect structure is formed in the first insulating layer, and the second and third interconnect structures are formed in the second insulating layer, and wherein the second interconnect structure is isolated from the third interconnect structure; and a plug structure formed in the first insulating layer, wherein a first end of the plug structure is electrically connected to the device structure through the first interconnect structure, and a second end of the plug structure is electrically connected to a conductive material layer in the DTC that is away from the substrate through the second interconnect structure, wherein the third interconnect structure is electrically connected to a conductive material layer in the DTC that is proximate to the substrate.

2. The semiconductor device of claim 1, wherein the plug structure extends from the first insulating layer into the first substrate, and further extends through the first substrate.

3. The semiconductor device of claim 1, wherein an end surface of the plug structure located within the first insulating layer is in a same layer as any one of conductive layers in the first interconnect structure.

4. The semiconductor device of claim 1, wherein the DTC comprises: a stack of at least two conductive material layers and at least one dielectric material layer located between adjacent conductive material layers, which are formed in a deep trench in the backside of the first substrate, wherein the at least two conductive material layers and the dielectric material layer further extend to the backside of the first substrate around the deep trench, and wherein each conductive material layer is electrically isolated from the first substrate.

5. The semiconductor device of claim 4, further comprising:

a first pad and, a second pad, each of the first and second pads formed on a side of the second insulating layer facing away from the first substrate, wherein the first pad is electrically connected to a portion of the at least two conductive material layers in the DTC that is away from the substrate and the second end of the plug structure through the second interconnect structure, and wherein the second pad is electrically connected to a remaining portion of the at least two conductive material layers in the DTC that is proximate to the substrate through the third interconnect structure; and a passivation layer formed on the side of the second insulating layer facing away from the first substrate, wherein the passivation layer extends from the second insulating layer and covers a portion of the first pad and a portion of the second pad.

6. The semiconductor device of claim 1, further comprising a second substrate bonded to a side of the first insulating layer facing away from the first substrate.

7. The semiconductor device of claim 6, wherein the second substrate is bonded to the first substrate through a bonding layer that is bonded to the first insulating layer or the second insulating layer.

8. The semiconductor device of claim 1, wherein each of the first and second insulating layers comprises a single layer or a plurality of dielectric layers.

9. The semiconductor device of claim 1, wherein each of the first and second interconnect structures comprises a plurality of conductive layers stacked one above another and at least one conductive plug connecting adjacent conductive layers.

10. The semiconductor device of claim 9, wherein each conductive layer of the first and/or second interconnect structures is formed in a corresponding dielectric layer in the first insulating layer and/or the second insulating layer.

11. A method for making a semiconductor device, comprising:

providing a first substrate having a front side and a backside opposite to the front side, wherein a device structure is formed at the front side of the first substrate;

forming a first insulating layer on the front side of the first substrate;

forming a first interconnect structure and a plug structure in the first insulating layer, wherein the plug structure extends from the first insulating layer into the first substrate, and wherein a first end of the plug structure is electrically connected to the device structure through the first interconnect structure;

forming a deep trench capacitor (DTC) on the backside of the first substrate;

forming a second insulating layer on the backside of the first substrate; and forming a second interconnect structure and a third interconnect structure in the second insulating layer, wherein the second insulating layer covers the DTC and a second end of the plug structure, and wherein the plug structure is electrically connected at the second end to a conductive material layer in the DTC that is away from the substrate through the second interconnect structure, wherein the third interconnect structure is electrically connected to a conductive material layer in the DTC that is proximate to the substrate.

12. The method of claim 11, wherein the plug structure extends from the first insulating layer into the first substrate, and further extends through the first substrate.

13. The method of claim 11, wherein in a process of forming the first interconnect structure in the first insulating layer, during a formation of any conductive layer in the first interconnect structure, a hole is formed in the first insulating layer, and a conductive material is filled into the hole to form the plug structure, wherein an end surface of the plug structure located within the first insulating layer is in a same layer as any one of conductive layers in the first interconnect structure.

14. The method of claim 11, further comprising, before the DTC is formed on the backside of the first substrate, bonding the first insulating layer to a second substrate and partially removing the first substrate from the backside thereof so that the second end of the plug structure is exposed.

15. The method of claim 14, wherein bonding the first insulating layer to the second substrate comprises bonding the first insulating layer or the second insulating layer to a bonding layer.

16. The method of claim 11, wherein forming the DTC on the backside of the first substrate comprises:

forming a deep trench in the backside of the first substrate;

forming a stack of at least two conductive material layers and at least one dielectric material layer located between adjacent conductive material layers, to form the DTC, wherein the at least two conductive material layers and the dielectric material layer further extend to the backside of the first substrate around the deep trench, and wherein each conductive material layer is electrically isolated from the first substrate.

17. The method of claim 16, wherein during the formation of the second interconnect structure and the third interconnect structure in the second insulating layer, the method further comprises:

forming a first pad and a second pad on a side of the second insulating layer facing away from the first substrate, wherein the first pad is electrically connected to a portion of the at least two conductive material layers in the DTC that is away from the substrate and the second end of the plug structure through the second interconnect structure, and wherein the second pad is electrically connected to a remaining portion of the at least two conductive material layers in the DTC that is proximate to the substrate through the third interconnect structure; and forming a passivation layer on the side of the second insulating layer facing away from the first substrate, wherein the passivation layer extends from the second insulating layer and covers a portion of the first pad and a portion of the second pad.

* * * * *